US006218896B1

(12) United States Patent
Becker et al.

(10) Patent No.: US 6,218,896 B1
(45) Date of Patent: Apr. 17, 2001

(54) VECTORED DEMODULATION AND FREQUENCY ESTIMATION APPARATUS AND METHOD

(75) Inventors: Donald W. Becker, Rancho Santa Fe; William E. L. Leigh, Del Mar, both of CA (US)

(73) Assignee: Tachyon, Inc., San Diego, CA (US)

( * ) Notice: Subject to any disclaimer, the term of this patent is extended or adjusted under 35 U.S.C. 154(b) by 0 days.

(21) Appl. No.: 09/407,642

(22) Filed: Sep. 28, 1999

Related U.S. Application Data

(60) Provisional application No. 60/151,282, filed on Aug. 27, 1999.

(51) Int. Cl.[7] .................................................. H04L 27/22
(52) U.S. Cl. ......................... 329/304; 375/324; 375/329
(58) Field of Search .............................. 329/304; 375/324, 375/329

(56) References Cited

U.S. PATENT DOCUMENTS

| | | |
|---|---|---|
| 3,611,435 | 10/1971 | Cooper . |
| 3,818,453 | 6/1974 | Schmidt et al. . |
| 4,543,574 | 9/1985 | Takagi et al. . |
| 4,545,061 | 10/1985 | Hileman . |
| 4,555,782 | 11/1985 | Alaria et al. . |
| 4,736,371 | 4/1988 | Tejima et al. . |
| 4,763,325 | 8/1988 | Wolfe et al. . |
| 4,774,707 | 9/1988 | Raychaudhuri . |
| 4,811,200 | 3/1989 | Wagner et al. . |
| 4,837,786 | 6/1989 | Gurantz et al. . |
| 4,841,527 | 6/1989 | Raychaudhuri et al. . |
| 4,868,795 | 9/1989 | McDavid et al. . |
| 5,012,469 | 4/1991 | Sardana . |
| 5,121,387 | 6/1992 | Gerhardt et al. . |
| 5,159,592 | 10/1992 | Perkins . |
| 5,166,929 | 11/1992 | Lo . |
| 5,172,375 | 12/1992 | Kou . |

(List continued on next page.)

FOREIGN PATENT DOCUMENTS

| | | |
|---|---|---|
| 0 026 603 | 4/1981 | (EP) . |
| 0 097 309 | 1/1984 | (EP) . |
| 0 584 820 A1 | 3/1994 | (EP) . |
| 0 722 228 A2 | 7/1996 | (EP) . |
| 0 755 164 A2 | 1/1997 | (EP) . |

(List continued on next page.)

Primary Examiner—Siegfried H. Grimm
(74) Attorney, Agent, or Firm—Knobbe Martens Olsen & Bear, LLP

(57) ABSTRACT

A method and apparatus for digitally demodulating QPSK signals includes a first portion in which the digitally sampled data burst is resampled with a plurality of predetermined timing hypotheses. The timing offset is determined according to an analysis of the resampled data. The digitally sampled data burst is then resampled according to the timing estimation. Modulation of the resampled data burst is then removed by twice squaring the complex I/Q pairs. The data with the modulation removed is then subjected to a Chirp-Z Transform to move the data into the frequency domain. The highest spectral power is used to determine the frequency offset. The phase offset is determined and the resampled data burst is derotated and dephased according to the phase offset and the frequency offset.

23 Claims, 3 Drawing Sheets

FIGURE 1:
TACHYON CORRELATION-BASED APPROACH TO ESTIMATION OF RESAMPLE TIMING FREQUENCY AND PHASE OFFSETS FOR QPSK DEMODULATION

U.S. PATENT DOCUMENTS

| Patent | Date | Inventor |
|---|---|---|
| 5,216,427 | 6/1993 | Yan et al. . |
| 5,239,677 | 8/1993 | Jasinski . |
| 5,276,703 | 1/1994 | Budin et al. . |
| 5,297,144 | 3/1994 | Gilbert et al. . |
| 5,345,583 | 9/1994 | Davis . |
| 5,381,443 | 1/1995 | Borth et al. . |
| 5,384,777 | 1/1995 | Ahmadi et al. . |
| 5,420,864 | 5/1995 | Dahlin et al. . |
| 5,471,473 | 11/1995 | Tejima . |
| 5,485,464 | 1/1996 | Strodtbeck et al. . |
| 5,490,087 | 2/1996 | Redden et al. . |
| 5,537,397 | 7/1996 | Abramson . |
| 5,539,730 | 7/1996 | Dent . |
| 5,541,924 | 7/1996 | Tran et al. . |
| 5,550,992 | 8/1996 | Hashimoto . |
| 5,566,168 | 10/1996 | Dent . |
| 5,570,355 | 10/1996 | Dail et al. . |
| 5,577,024 | 11/1996 | Malkamaki et al. . |
| 5,586,121 | 12/1996 | Moura et al. . |
| 5,612,703 | 3/1997 | Mallinckrodt . |
| 5,613,195 | 3/1997 | Ooi . |
| 5,615,212 | 3/1997 | Ruszczyk et al. . |
| 5,638,361 | 6/1997 | Ohlson et al. . |
| 5,642,354 | 6/1997 | Spear . |
| 5,644,576 | 7/1997 | Bauchot et al. . |
| 5,651,009 | 7/1997 | Perreault et al. . |
| 5,652,892 | 7/1997 | Ugajin . |
| 5,673,322 | 9/1997 | Pepe et al. . |
| 5,677,909 | 10/1997 | Heide . |
| 5,678,208 | 10/1997 | Kowalewski et al. . |
| 5,696,903 | 12/1997 | Mahany . |
| 5,704,038 | 12/1997 | Mueller et al. . |
| 5,706,278 | 1/1998 | Robillard et al. . |
| 5,732,328 | 3/1998 | Mitra et al. . |
| 5,734,833 | 3/1998 | Chiu et al. . |
| 5,745,485 | 4/1998 | Abramson . |
| 5,758,088 | 5/1998 | Bezaire et al. . |
| 5,768,254 | 6/1998 | Papadopoulos et al. . |
| 5,790,533 | 8/1998 | Burke et al. . |
| 5,790,535 | 8/1998 | Kou . |
| 5,790,551 | 8/1998 | Chan . |
| 5,790,939 | 8/1998 | Malcolm et al. . |
| 5,790,940 | 8/1998 | Laborde et al. . |
| 5,796,726 | 8/1998 | Hassan et al. . |
| 5,802,061 | 9/1998 | Agarwal . |
| 5,805,018 * | 9/1998 | Harima ................................ 329/304 |
| 5,809,093 | 9/1998 | Cooper . |
| 5,809,400 | 9/1998 | Abramsky et al. . |
| 5,809,414 | 9/1998 | Coverdale et al. . |
| 5,815,652 | 9/1998 | Ote et al. . |
| 5,815,798 | 9/1998 | Bhagalia et al. . |
| 5,818,831 | 10/1998 | Otonari . |
| 5,818,845 | 10/1998 | Moura et al. . |
| 5,818,887 | 10/1998 | Sexton et al. . |
| 5,822,311 | 10/1998 | Hassan et al. . |
| 5,828,655 | 10/1998 | Moura et al. . |
| 5,848,064 | 12/1998 | Cowan . |
| 5,859,852 | 1/1999 | Moura et al. . |
| 5,862,452 | 1/1999 | Cudak et al. . |
| 5,872,820 | 2/1999 | Upadrasta . |
| 5,889,766 | 3/1999 | Ohnishi et al. . |
| 5,905,719 | 5/1999 | Arnold et al. . |
| 5,909,447 | 6/1999 | Cox et al. . |
| 5,910,945 | 6/1999 | Garrison et al. . |
| 5,915,207 | 6/1999 | Dao et al. . |
| 5,926,458 | 7/1999 | Yin . |
| 5,946,602 | 8/1999 | Sayegh . |
| 5,958,018 | 9/1999 | Eng et al. ............................ 709/246 |
| 5,959,982 | 9/1999 | Federkins et al. ................... 370/336 |
| 5,960,001 | 9/1999 | Shaffer et al. ....................... 370/448 |
| 5,963,557 | 10/1999 | Eng ...................................... 370/432 |
| 5,966,412 | 10/1999 | Ramaswamy ........................ 375/341 |
| 5,966,636 | 10/1999 | Corrigan et al. ..................... 455/4.2 |

FOREIGN PATENT DOCUMENTS

| | | |
|---|---|---|
| 0 889 660 A2 | 1/1999 | (EP) . |
| 0 889 664 A2 | 1/1999 | (EP) . |
| 0 901 253 A2 | 3/1999 | (EP) . |
| 0 912 015 A2 | 4/1999 | (EP) . |
| 0 912 016 A2 | 4/1999 | (EP) . |
| 0 913 968 A1 | 5/1999 | (EP) . |
| 0 913 970 A1 | 5/1999 | (EP) . |
| 0 915 592 A1 | 5/1999 | (EP) . |
| 0 917 317 A1 | 5/1999 | (EP) . |
| 0 920 226 A2 | 6/1999 | (EP) . |
| 0 923 266 | 6/1999 | (EP) . |
| 94/19530 | 9/1994 | (WO) . |
| 95/34153 | 12/1995 | (WO) . |
| 96/05690 | 2/1996 | (WO) . |
| 96/11535 | 4/1996 | (WO) . |
| 97/11566 | 3/1997 | (WO) . |
| 97/37457 | 10/1997 | (WO) . |
| 97/38502 | 10/1997 | (WO) . |
| 97/47158 | 12/1997 | (WO) . |
| 97/50249 | 12/1997 | (WO) . |
| 98/12829 | 3/1998 | (WO) . |
| 98/12833 | 3/1998 | (WO) . |
| 98/16046 | 4/1998 | (WO) . |
| 98/19466 | 5/1998 | (WO) . |
| 98/20724 | 5/1998 | (WO) . |
| 98/23112 | 5/1998 | (WO) . |
| 98/24250 | 6/1998 | (WO) . |
| 98/37669 | 8/1998 | (WO) . |
| 98/37706 | 8/1998 | (WO) . |
| 98/44747 | 10/1998 | (WO) . |
| 98/47236 | 10/1998 | (WO) . |
| 98/49625 | 11/1998 | (WO) . |
| 98/54858 | 12/1998 | (WO) . |
| 98/54859 | 12/1998 | (WO) . |
| 99/04338 | 1/1999 | (WO) . |
| 99/04508 | 1/1999 | (WO) . |
| 99/04509 | 1/1999 | (WO) . |
| 99/04521 | 1/1999 | (WO) . |
| 99/05828 | 2/1999 | (WO) . |
| 99/13616 | 3/1999 | (WO) . |
| 99/14963 | 3/1999 | (WO) . |
| 99/16201 | 4/1999 | (WO) . |
| 99/19996 | 4/1999 | (WO) . |
| 99/19999 | 4/1999 | (WO) . |
| 99/21287 | 4/1999 | (WO) . |
| 99/21291 | 4/1999 | (WO) . |
| 99/21296 | 4/1999 | (WO) . |
| 99/21328 | 4/1999 | (WO) . |
| 99/21329 | 4/1999 | (WO) . |
| 99/21378 | 4/1999 | (WO) . |
| 99/21381 | 4/1999 | (WO) . |
| 99/22500 | 6/1999 | (WO) . |
| 99/39480 | 8/1999 | (WO) . |

* cited by examiner

VECTORED DEMODULATION AND FREQUENCY ESTIMATION APPARATUS AND METHOD

This application claim benefit to provisional application Ser. No. 60/151,282 Aug. 27, 1999.

BACKGROUND OF THE INVENTION

1. Field of the Invention

This invention related generally to wireless communication systems. More specifically, the invention relates to digital demodulation of quadrature phase shift keying (QPSK) signals.

2. Description of the Related Art

The demodulation of QPSK signals can be accomplished digitally employing a tracking loop approach. A tracking loop generates the resample timing and is also used to remove the frequency and phase offsets, also referred to as the residual frequency and phase, from the incoming data symbols. Typically, such systems operate on one new sample pair at a time. Such systems employ feedback loops to track and correct for timing, frequency and phase offsets in the incoming data stream.

These feedback loops require careful setting of the tracking loop gains. In addition, they require an acquisition period over which the feedback loops have time to lock. Such known systems require the use of a relatively long preamble at the beginning of each new data transmission in order to provide the feedback loops time to lock. Such known systems also typically estimate timing, frequency and phase using localized loop metrics (typically over a few data samples), which can lead to increased error rates. Further, due to the local decisions used in tracking loops, implementing such systems in a digital signal processor chip limits the processing speeds with which such systems can operate.

Therefore, there is a need for method and apparatus for digitally demodulating QPSK signals, which overcomes these shortcomings.

SUMMARY OF THE INVENTION

The method and apparatus for digitally demodulating QPSK signals can comprise a first portion in which the digitally sampled data burst is resampled at a plurality of predetermined timing hypotheses. The maximum power of each of the hypotheses is determined. The hypothesis with the maximum power is used to interpolate a resampled timing estimation. The resampled timing estimation is then used to resample the data burst. Modulation of the resampled data burst is then removed by twice squaring the complex I/Q pairs ($Z=I+j*Q$). This $Z^4$ data represents frequency and phase that are four times the frequency and phase of the Z data. The data with the modulation removed is then subjected to a Chirp-Z transform to move the data into the frequency domain.

The spectral power over the data set of the Chirp-Z data transform is then determined. The highest spectral power is determined and quadratically interpolated. This interpolated value is 4 times the residual demodulation frequency.

The phase of the data is estimated by derotating the $Z^4$ data by a vector of data rotating at negative 4 times the residual frequency (four times the frequency rotating in the opposite direction). The vector used for derotating has a starting phase of 0 and a magnitude of 1. The resulting derotated complex data are summed over the data set. The arc tangent of the resulting sum is 4 times the desired starting phase. The frequency estimation and phase estimation are then used to derotate and dephase the resampled data, which results in resampled data corrected for timing, frequency and phase.

The Chirp-Z Transform can offer several advantages when used to estimate residual frequency in QPSK demodulation. Digital demodulation of QPSK signals generally employs frequency estimation to remove residual frequency from the incoming data symbol information. The Fast Fourier Transform (FFT) or a series of small overlapped FFTs is generally used to perform this estimation.

One embodiment of the invention uses a Chirp-Z Transform approach to frequency estimation, which provides three principal advantages over the FFT and Direct Fourier Transform (DFT) approaches.

1) An arbitrary frequency range can be specified over which to perform the estimation. The FFT requires the frequency range to equal the sampling rate (Fs), from –Fs/2 to Fs/2.

2) An arbitrary number of frequency estimation points may be specified (and therefore arbitrary frequency estimation resolution). The FFT requires that the number of frequency estimation points equal the number of input points (N). Therefore in the FFT the frequency estimation resolution is fixed at Fs/N.

3) Compared to DFT processing (which has the same flexibility as Chirp-Z Transform estimation) the Chirp-Z Transform estimator operates 5.6 times faster than the DFT for a 97-point estimate, 9.7 times faster than the DFT for a 193-point estimate, and 17.8 times faster than the DFT for a 385-point estimate.

BRIEF DESCRIPTION OF THE DRAWINGS

These and further features, objectives and advantages of the invention will become apparent from the detailed description set forth below when taken in conjunction with the drawings wherein like parts are identified with like reference numerals throughout and wherein.

DETAILED DESCRIPTION OF THE PREFERRED EMBODIMENT

Figure 1:
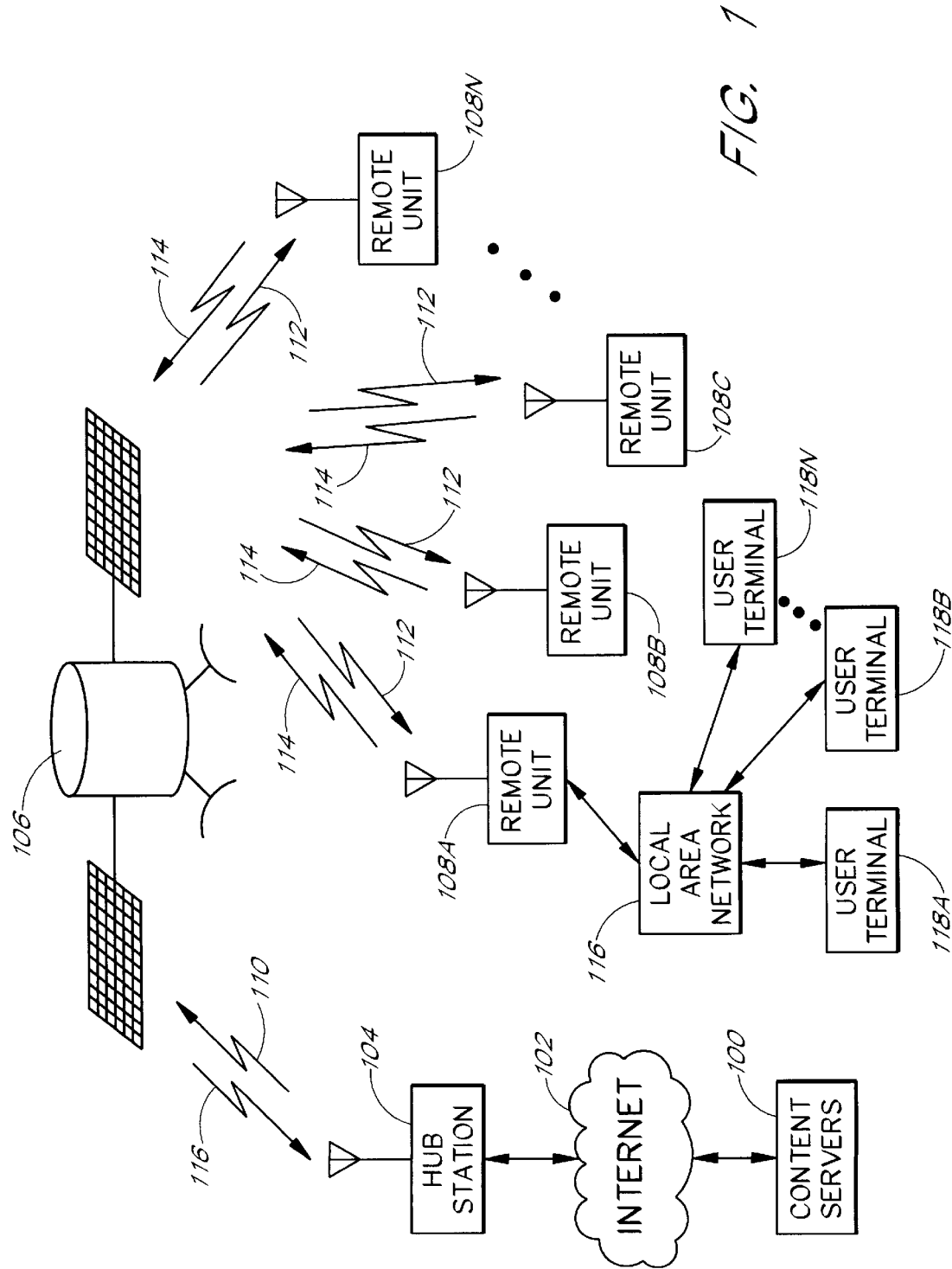
FIG. 1 is a block diagram showing a satellite-based communication system.

FIG. 1 is a block diagram illustrating an exemplifying system in which the invention may be embodied. The system in FIG. 1 provides high-speed, reliable Internet communication service over a satellite link.

In particular, in FIG. 1, content servers 100 are coupled to an Internet 102 which is in turn coupled to a hub station 104 such that the hub station 104 can request and receive digital data from the content servers 100. The hub station 104 also communicates via satellite 106 with a plurality of remote units 108A–108N. For example, the hub station 104 transmits signals over a forward uplink 110 to the satellite 106. The satellite 106 receives the signals from the forward uplink 110 and re-transmits them on a forward downlink 112. Together, the forward uplink 110 and the forward downlink 112 are referred to as the forward link. The remote units 108A–108N monitor one or more channels that comprise the forward link in order to receive remote-unit-specific and broadcast messages from the hub station 104.

In a similar manner, the remote units 108A–108N transmit signals over a reverse uplink 114 to the satellite 106. The satellite 106 receives the signals from the reverse uplink 114 and re-transmits them on a reverse downlink 116. Together, the reverse uplink 114 and the reverse downlink 116 are referred to as the reverse link. The hub station 104 monitors one or more channels which comprise the reverse link in order to extract messages from the remote units 108A–108N. For example, in one embodiment of the exemplifying system, the reverse link carries multiple access channels in accordance with assignee's co-pending application entitled METHOD AND APPARATUS FOR MULTIPLE ACCESS IN A COMMUNICATION SYSTEM, application Ser. No. 09/407,639 [Attorney Docket No. TACHYON.018CP2], filed concurrently herewith, the entirety of which is hereby incorporated by reference.

In one embodiment of the exemplifying system, each remote unit 108A–108N is coupled to a plurality of system users. For example, in FIG. 1, the remote unit 108A is shown as coupled to a local area network 116 which in turn is coupled to a group of user terminals 118A–118N. The user terminals 118A–118N may be one of many types of local area network nodes such as a personal or network computer, a printer, digital meter reading equipment or the like. When a message is received over the forward link intended for one of the user terminals 118A–118N, the remote unit 108A forwards it to the appropriate user terminal 118 over the local area network 116. Likewise, the user terminals 118A–118N can transmit messages to the remote unit 108A over the local area network 116.

In one embodiment of the exemplifying system, the remote units 108A–108N provide Internet service to a plurality of users. For example, assume that the user terminal 118A is a personal computer that executes browser software in order to access the World Wide Web. When the browser receives a request for a web page or embedded object from the user, the user terminal 118A creates a request message according to well-known techniques. The user terminal 118A forwards the request message over the local area network 116 to the remote unit 108A, also using well-known techniques. Based upon the request message, the remote unit 108A creates and transmits a wireless link request over a channel within the reverse uplink 114 and the reverse downlink 116. The hub station 104 receives the wireless link request over the reverse link. Based upon the wireless link request, the hub station 104 passes a request message to the appropriate content server 100 over the Internet 102.

In response, the content server 100 forwards the requested page or object to the hub station 104 over the Internet 102. The hub station 104 receives the requested page or object and creates a wireless link response. The hub station transmits the wireless link response over a channel within the forward uplink 110 and forward downlink 112. For example, in one embodiment of the exemplifying system, the hub station 104 operates in accordance with assignee's co-pending application entitled TRANSMISSION OF TCP/IP DATA OVER A WIRELESS COMMUNICATION CHANNEL, application Ser. No. 09/407,646 [Attorney Docket No. TACHYON.046A], and assignee's co-pending application entitled METHOD AND SYSTEM FOR FREQUENCY SPECTRUM RESOURCE ALLOCATION, application Ser. No. 09/407,645 [Attorney Docket No. TACHYON.039A], each of which is filed concurrently herewith and the entirety of which is hereby incorporated by reference.

The remote unit 108A receives the wireless link response and forwards a corresponding response message to the user terminal 118A over the local area network 116. In one embodiment of the exemplifing system, the process of retrieving a web page or object is executed in accordance with assignee's co-pending application entitled DISTRIBUTED SYSTEM AND METHOD FOR PREFETCHING OBJECTS, application Ser. No. 09/129,142 [Attorney Docket No. TACHYON.001A2], filed Aug. 5, 1998, the entirety of which is hereby incorporated by reference. In this way, a bidirectional link between the user terminal 118A and the content servers 100 is established.

In a system such as described above in connection with FIG. 1, the remote units tend to generate bursty data. Bursty data is characterized in that it has a high peak-to-average traffic ratio. That means that blocks of data are transferred during short periods of time, interposed between significantly longer periods of idleness. The transmission of a remote station is referred to herein as a data burst.

The hub station 104 provides communication resources to the remote units 118A–N. The communication resources within the hub station 104 may be quantized into a series of communication resources according to one of a plurality of well-known techniques. The hub station 104 may comprise or implement one or more processes that enable it to carry out the functions of the invention. The processes may be embodied, for example, within one or more integrated circuits such as a digital signal processor, an application-specific integrated circuit (ASIC), and/or maybe embodied within software or firmware routines stored within the hub station 104 that are executed by a microcontroller or other processor such as a digital signal processor.

The communication resources may be divided into a series of code division multiple access (CDMA) channels. In a CDMA system, the channels may be defined by a series of pseudo random, nearly orthogonal sequences. Each sequence in the series defines a separate communication resource that can be used by a remote unit to communicate with the hub station. Alternatively, the system may use time division multiple access (TDMA) timeslot channels to subdivide the communication resources. In a TDMA system, remote units are assigned a timeslot in which to transmit. By limiting transmissions to fall within the assigned timeslot, the remote units are able to share the communication resources provided by the hub station. Further, the system can use a combination of TDMA and frequency division multiple access (FDMA). In any of these or other multiple access techniques, the data being transmitted in a data burst can be encoded into a quadrature phase shift keying symbol set.

Figure 2:
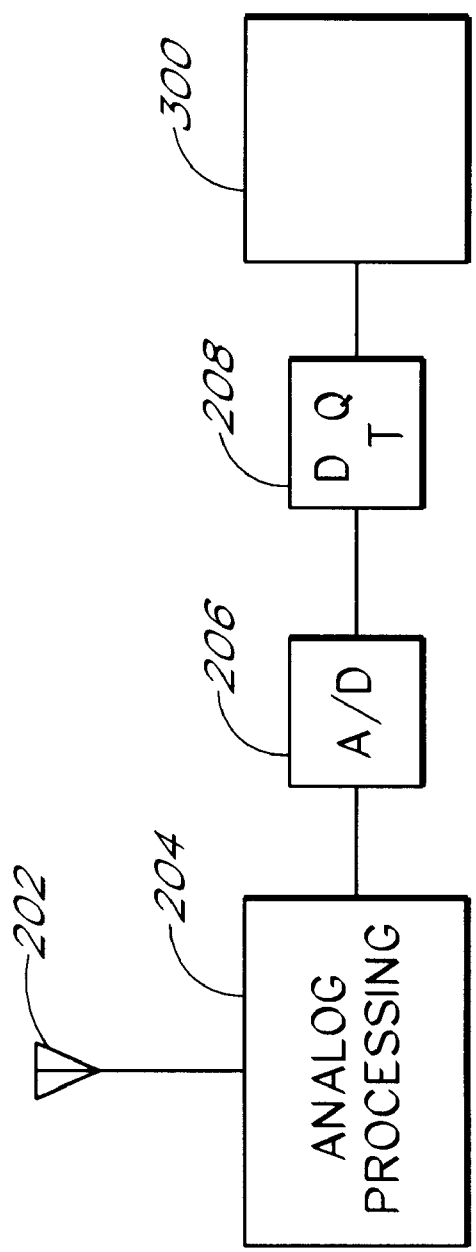
FIG. 2 is a block diagram of a receiver.

FIG. 2 is a block diagram of a receiver portion of the hub station 104 (FIG. 1) for receiving signals on the reverse downlink 116. Additionally, the receiver portion can be used in the remote units 108A–N for receiving signals over the forward downlink 112 (FIG. 1) or in other wireless systems. The receiver portion includes an antenna 202 that receives a signal and transmits it to an analog processing portion 204. The analog processing portion 204 performs analog processing on the signal, such as down-conversion, power control, and filtering according to processes and using apparatus well known to those of ordinary skill in the art. After analog processing, the signal is passed to an analog-to-digital converter 206. The analog-to-digital converter 206 samples the analog signal and accomplishes band pass filtering. A digital quadrature tuner (DQT) 208 receives the digitally sampled signal from the analog-to-digital converter 206. The DQT 208 fine-tunes the desired frequency and filters out other frequencies. The DQT 208 also changes the data rate to approximately twice the symbol rate. The digitized QPSK signal is then passed to a demodulator 300. Alternatively, the digitized signal may be processed further before being provided to the demodulator 300. In one embodiment, the demodulator 300 is a digital signal processor that executes a stored program.

Figure 3:
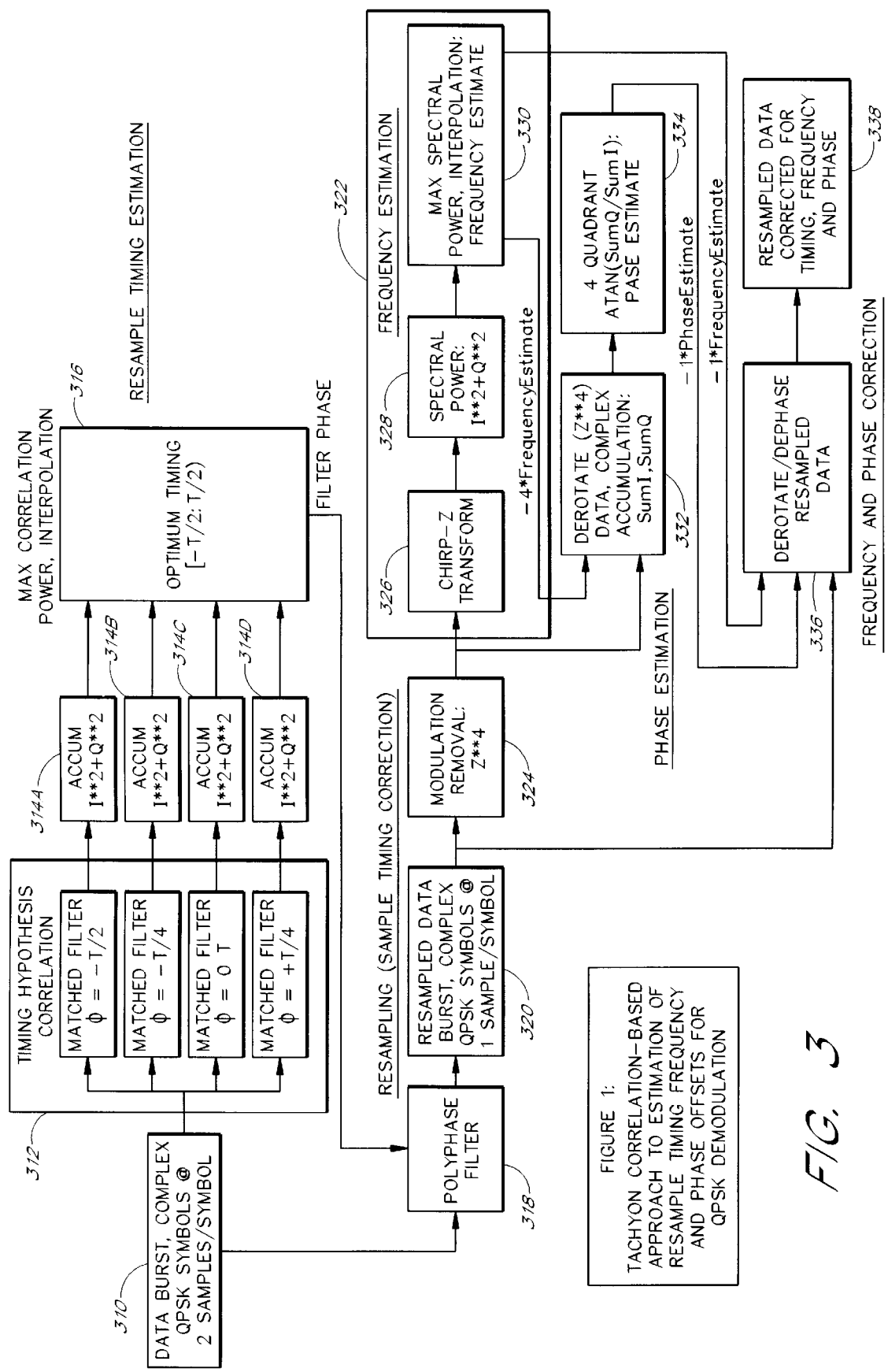
FIG. 3 is a diagram illustrating a process and apparatus for demodulating a QPSK signal.

FIG. 3 is a block diagram illustrating a method and apparatus for demodulating the digitized QPSK signal, which can be carried out by the demodulator 300. As was noted above, the process represented by FIG. 3 can be implemented in software or firmware running on a processor, for example, a digital signal processor. Each block of FIG. 3 can be implemented as a section of software or firmware or as hardware. In addition, the functions represented by the blocks can be combined into larger sections of software, firmware or hardware.

In block 310, the demodulator 300 receives and stores in a memory location an incoming data burst or packet of QPSK symbols that has been digitally sampled. In one embodiment, the data burst is sampled at twice the symbol rate of the QPSK transmission. The entire data burst is then resampled in a resampling section at four separate timing hypotheses as represented by block 312. In one embodiment, the re-sampling is implemented as four filtering functions using four separate phases of a polyphase-matched filter. The four filtering functions correspond to offsets, for example, of −½, −¼, 0 and +¼ of the symbol timing. Additionally, different timing hypotheses can also be used. The optimum number of timing hypotheses and their offsets for a specific system can be determined through system simulations.

As represented by blocks 314A–D, the product $I^2+Q^2$ over the entire data burst is accumulated for each of the timing hypotheses. The product $I^2+Q^2$ over the entire data burst represents an energy value for each of the timing hypotheses. The energy value represents the correlation of each timing hypothesis with the data burst. In other words, the timing hypothesis which most closely correlates with the timing offset of the actual input data burst will have the highest energy value over the data burst.

As represented by block 316, the four energies from block 314A–D are examined to determine which of the timing hypotheses had the highest correlation. The energy with the highest correlation is determined. The energy with the highest correlation and its two neighbors are then quadratically interpolated to yield a timing estimate. The timing estimate is also constrained by the granularity or resolution of the polyphase filter represented by block 318. A polyphase filter represented by block 318 resamples the data burst using the timing estimate from block 316. This re-sampling results in a data set which consists of complex I/Q samples at an effective sampling rate of one complex sample per symbol. The determination of the timing estimate and the subsequent resampling of one sample per symbol represented by blocks 312, 314 and 316 can reduce the computational load on all the remaining processing blocks because only data sampled at one sample per symbol, using the timing estimate, will be processed from this point forward.

The resampled data burst of complex QPSK symbols represented by block 320 next will have the frequency offset and phase offset removed. First, as represented by block 324, the complex I/Q pairs, with $Z=I+j*Q$, are squared twice ($Z^4$) which removes the data modulation. This operation has the effect of putting all the complex data into the same quadrant, thereby resolving quadrant ambiguity. The $Z^4$ data represents frequencies and phases which are four times the frequencies and phases of the Z data.

The frequency offset estimation is generally represented by block 322. As represented by block 326, the resulting set of $Z^4$ data are transformed into the frequency domain using a Chirp-Z transform. The Chirp-Z transform allows the transformation of a small, high resolution section of the entire spectrum. The FFT does not directly provide as high a resolution estimation of the frequency spectrum.

The Chirp-Z Transform frequency estimation algorithm used in an embodiment of the invention is performed as follows:

1) The frequency range over which estimation will be performed (freq_range) is selected, and the number of input points (N) and number of estimation output points (K) is selected. N and K are generally selected such that the filter convolution step can be performed in a convenient FFT size. Therefore FFT_SIZE=(N+K−1) is selected as the nearest power of 2.

The frequency estimation resolution equals
Phi_0=freq_range/(K−1).
The starting point on the unit circle for the Chirp-Z contour will be
Theta_0=−(K−1)/2*Phi_0.
The ending point on the unit circle for the Chirp-Z contour will be
Theta_1=(K−1)/2*Phi_0.

2) Three data vectors are designed and stored for use during processing.

Complex values A and W are defined as:
A=exp(j*2$_{PI*Theta}$_0)=cos (2_PI*Theta_0)+j* sin (2_PI*Theta_0) and
W=exp(j*2¯PI*Phi_0)=cos (2_PI*Phi_0)+j* sin (2_PI*Phi_0).

a) The first data vector vec_1(n) consists of N points (n=0 . . . N−1) defined as
vec_1(n)=A**(−n)*W(n2/2)=
exp (−2_PI*n*Theta_0)*exp(j*2_PI*Phi_0*(n**2/2))=
{cos (2_PI*n*Theta_0)−j* sin (2_PI*n*Theta_0)}*
{cos (2_PI*Phi_0*(n**2/2))+j* sin (2$_{\_PI*Phi}$_0*(n**2/2))}.

b) The second vector is a filter Filt_2(n) and consists of FFT_SIZE points.
The first N points (n=0 . . . N−1) are defined to be
Filt_2(n)=W(−(n2/2))=
exp(−j*2_PI*Phi_0*(n**2/2))=
cos (2_PI*Phi_0*(n**2/2))−j* sin (2_PI*Phi_0* (n**2/2)).
The last (K−1) points (n=N . . (FFT_SIZE−1)) are defined to be
Filt_2(n)=W(−((FFT_SIZE-n)2/2))=
exp(−j*2_PI*Phi_0*((FFT_SIZE-n)**2.2))=
cos (2_PI*Phi_0*((FFT-SIZE-n)**2/2))−j* sin (2_PI*Phi_0*((FFT_SIZE-n)**2/2)).

This filter should convolve data from the previous vector multiplication, and the fastest way to accomplish this is in the frequency domain. Therefore this filter is converted into the frequency domain by the Fast Fourier Transform and stored as FFT_SIZE frequency domain filter values in memory.

c) The third data vector vec_3(k) consists of K points (k=0 . . . K−1) defined as
vec_3(k)=W(k2/2)=
expo(j*2_PI*Phi_0*(k**2/2))=
cos (2_PI*Phi_0*(k**2/2))+j* sin (2_PI*Phi_0* (k**2/2)).

3) The Chirp-Z Transform now consists of multiplying the N complex input points by the complex vector vec_1, padding these N points with K−1 zeroes to make its length equal FFT_SIZE, and performing an FFT on this data set. This frequency domain data is multiplied point by point with the frequency domain version of Filt_2. This product is next Inverse Fast Fourier Transformed (IFFT'd), which accomplishes a quick convolution of the data premultiplied by vec-1 with Filt_2. This filtered data output is now multiplied point by point with vec_3, resulting in the Chirp-Z Transform of the original data set.

As represented by block 328, the spectral power over the data set of the Chirp-Z-transformed data is then determined. In block 330, the highest spectral power is determined and quadratically interpolated with its two nearest neighbors to determine the residual frequency. This interpolated value is the best estimate of 4 times the residual demodulation frequency.

To estimate the phase offset, the set of complex data pairs which has had the modulation removed in the process represented by block 324 are derotated by a vector of data rotating at negative 4 times the residual frequency, as represented by block 332. The value of negative 4 times the residual frequency was determined by the process represented by block 330. The vector used for derotation has a starting phase of 0 and a magnitude of 1. The derotated complex data are then summed in the process represented by block 332. In block 334 the arctangent of the resulting complex sum is determined and represents 4 times the desired phase offset estimate.

As represented by block 336, negative 1 times the phase estimate and negative 1 times the frequency estimate, which were determined during the processes represented by blocks 334 and 330, respectively, are then used to derotate the resampled data burst from block 320 using a vector of unit magnitude, with the starting phase of negative 1 times the phase estimate and a rotation of negative 1 times the frequency estimate. The derotation results in resampled data corrected for timing, frequency and phase, as represented by block 338.

It should be understood by those of ordinary skill in the art that start of message and quadrant lockup aspects of the burst data demodulation can be determined from the preamble section of the message packet in a manner conventionally used in digital communication and known to those of skill in the art.

The invention may be embodied in other specific forms without departing from its spirit or essential characteristics. The described embodiment is to be considered in all respects only as illustrative and not restrictive and the scope of the invention is, therefore, indicated by the appended claims rather than the foregoing description. All changes which come within the meaning and range of equivalency of the claims are to be embraced within their scope.

What is claimed is:

1. A demodulator for demodulating a digitally sampled data burst comprising:
   a resampling section configured to resample the digitally sampled data burst at a plurality of timing offsets;
   an evaluation section configured to evaluate the correlation of the resampling performed at the plurality of timing offsets by the resampling section and to determine a timing estimate;
   a polyphase filter configured to resample the digitally sampled data burst according to the timing estimate determined by the evaluation section and generate resampled data;
   a frequency estimation section configured to receive the resampled data from the polyphase filter and to determine a frequency offset;
   a phase estimation section configured to receive the resampled data from the polyphase filter and to determine a phase offset; and
   a phase/frequency correction section configured to receive the resampled data from the polyphase filter and to adjust the phase and frequency of the A resampled data according to the phase offset determined by the phase estimation section and the frequency offset determined by the frequency estimation section.

2. The demodulator according to claim 1, wherein said resampling section comprises a polyphase filter.

3. The demodulator according to claim 1, wherein said frequency estimation section comprises means for performing a Chirp-Z Transform of the resampled data from the polyphase filter.

4. The demodulator according to claim 1, wherein the evaluation section includes means for determining the power of the resampling performed at the plurality of timing offsets.

5. A demodulator for demodulating a digitally sampled data burst of QPSK data, the demodulator comprising:
   a first resampling section configured to resample the digitally sampled data burst at a plurality of timing hypotheses;
   a timing hypothesis correlation section configured to determine which of the plurality of timing hypotheses has the best correlation and to determine a timing estimate based thereon;
   a second resampling section configured to resample the digitally sampled data burst according to the timing estimate, and thereby generate complex I/Q samples;
   a data modulation removal section configured to receive the complex I/Q samples and move them all into the same quadrant, thereby generating Z data;
   a Chirp-Z Transform section configured to transform the Z data into the frequency domain;
   a frequency estimation section configured to estimate a frequency offset using the Chirp-Z transformed data;
   a phase estimation section configured to receive the Z data and estimate a phase offset.

6. The demodulator according to claim 5, wherein said first resampling section comprises a polyphase filter.

7. The demodulator according to claim 6, wherein said first resampling section and said second resampling section comprise the same polyphase filter.

8. The demodulator according to claim 5, wherein said timing hypothesis correlation section is configured to determine the energy of each resampling of the data burst carried out by said first resampling section.

9. The demodulator according to claim 5, wherein said frequency estimation section is configured to determine the spectral power over the Chirp-Z-transformed data.

10. A method of demodulating a digitally sampled data burst comprising:
    resampling the digitally sampled data burst with a plurality of timing hypotheses;
    determining the total energy of each of the timing hypotheses;
    determining a timing estimate based upon the energies of the timing hypotheses;
    resampling the digitally sampled data burst according to the timing estimate;

determining the frequency offset by transforming the resampled data burst into the frequency domain, determining the spectral power over the data set of the transformed data and utilizing the highest spectral power to determine the frequency offset; and determining the phase offset.

11. The method according to claim 10, wherein determining the frequency offset further comprises moving the transformed data into the same quadrant.

12. The method according to claim 11, wherein determining the frequency offset further comprises performing a Chirp-Z Transform on the data that has been moved to the same quadrant.

13. The method according to claim 10, wherein the digitally sampled data burst is resampled with a plurality of timing hypotheses using a polyphase filter.

14. The method according to claim 10, wherein the digitally sampled data burst is resampled according to the timing estimate using a polyphase filter.

15. The method according to claim 10, wherein determining the timing estimate further comprises determining the highest energy value over the data burst for each of the timing hypotheses.

16. A method of demodulating a digitally sampled data burst comprising:

resampling the digitally sampled data burst with a plurality of timing hypotheses to determine a timing estimate;

resampling the digitally sampled data burst based upon the timing estimate to obtain resampled data;

determining the frequency offset using the timing estimate;

determining the phase offset; and adjusting the phase and frequency of the resampled data according to the determined phase offset and the determined frequency offset.

17. The method of claim 16 further comprising determining the total energy of each of the timing hypotheses.

18. The method of claim 16 further comprising transforming the resampled data into the frequency domain, determining the spectral power over the data set of the transformed data and utilizing the highest spectral power to determine the frequency offset.

19. A demodulator for demodulating a digitally sampled data burst of QPSK data, the demodulator comprising:

a first resampling means for resampling the digitally sampled data burst at a plurality of timing hypotheses;

a correlation means for determining which of the plurality of timing hypothesis has the best correlation and for determining a timing estimate based thereon;

a second resampling means for resampling the digitally sampled data burst according to the timing estimate, and thereby generating complex I/Q samples;

a modulation removal means, coupled to receive the complex I/Q samples, for moving the complex I/Q samples into the same quadrant, thereby generating Z data;

a means for receiving the Z data and transforming the Z data into the frequency domain;

a frequency estimation means estimating a frequency offset using the transformed Z data; and a phase estimation means for receiving the Z data and estimating a phase offset.

20. The demodulator according to claim 19, wherein said first resampling means comprises a polyphase filter.

21. The demodulator according to claim 19, wherein said first resampling means and said second resampling means comprise the same polyphase filter.

22. The demodulator according to claim 19, wherein said correlation means comprises means for determining the energy of each resampling of the data burst carried out by said first resampling means.

23. The demodulator according to claim 22, wherein said frequency estimation means comprises means for determining the spectral power over the transformed Z data.

* * * * *